(12) United States Patent
Allenspach et al.

(10) Patent No.: US 8,817,531 B2
(45) Date of Patent: Aug. 26, 2014

(54) MAGNETIC RANDOM ACCESS MEMORY DEVICE AND METHOD FOR PRODUCING A MAGNETIC RANDOM ACCESS MEMORY DEVICE

(75) Inventors: Rolf Allenspach, Rueschlikon (CH); Carl Zinoni, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 13/702,165

(22) PCT Filed: Jun. 8, 2011

(86) PCT No.: PCT/IB2011/052491
§ 371 (c)(1),
(2), (4) Date: Feb. 19, 2013

(87) PCT Pub. No.: WO2012/001555
PCT Pub. Date: Jan. 5, 2012

(65) Prior Publication Data
US 2013/0208536 A1    Aug. 15, 2013

(30) Foreign Application Priority Data
Jun. 30, 2010 (EP) .................................. 10168021

(51) Int. Cl.
*G11C 11/15* (2006.01)
*G11C 11/16* (2006.01)
*H01L 43/08* (2006.01)

(52) U.S. Cl.
CPC ................ *G11C 11/15* (2013.01); *G11C 11/16* (2013.01)
USPC .... 365/158; 365/171; 257/421; 257/E21.665; 257/E43.001

(58) Field of Classification Search
CPC ................................ G11C 11/15; G11C 11/16
USPC ........................................................... 365/158
See application file for complete search history.

(56) References Cited

U.S. PATENT DOCUMENTS

| 7,245,524 B2 | 7/2007 | Yoda et al. |
| 2005/0242384 A1 | 11/2005 | Iwata et al. |
| 2008/0080233 A1 | 4/2008 | Hosotani et al. |
| 2008/0094874 A1* | 4/2008 | Liaw .............................. 365/158 |
| 2010/0157662 A1 | 6/2010 | Ono et al. |

FOREIGN PATENT DOCUMENTS

| EP | 1 612 865 | 1/2006 |
| WO | 2012001555 | 1/2012 |

OTHER PUBLICATIONS

Examination Report dated Oct. 22, 2013 for application No. GB1300264.7.
Examination report dated Oct. 22, 2013 for Application No. GB13000264.7.

(Continued)

*Primary Examiner* — Son Mai
(74) *Attorney, Agent, or Firm* — Jon A. Gibbons; Fleit Gibbons Gutman Bongini & Bianco PL (57) ABSTRACT

A magnetic random access memory (MRAM) device has read word lines, write word lines, bit lines, and a plurality of memory bit cells interconnected via the read word lines, the write word lines and the bit lines. Each memory bit cell has a fixed ferromagnetic layer element and a free ferromagnetic layer element separated by a dielectric tunnel barrier element. Each write word line and a respective number of free ferromagnetic layer elements are formed as a single continuous ferromagnetic line.

17 Claims, 4 Drawing Sheets

(56) References Cited

OTHER PUBLICATIONS

International Search Report and Written Opinion dated Oct. 7, 2011 for PCT/IB2011/052491.

Hu, X-Y, et al., "Write Amplification Analysis in Flash-Based Solid State Drives," SYSTOR'09, May 4-6, Haifa, Israel, Copyright 2009 978-1-60558-623-Jun. 9, 2005.

Iliadis, I., et al., "Research Report—Performance of the Greedy Garbage-Collection Scheme in Flash-Based Solid State Drives," Computer Science, 20 pgs., RZ3769 Mar. 26, 2010.

Menon, J., et al., "An Age-Threshold Algorithm for Garbage Collection in Log-Structured Arrays and File Systems," in High Performance Computing Systems and Applications, J. Schaeffer, ed., Kluwer Academic Publishers, 1998, 119-132.

Andre, T.W., et al., "A 4Mb 0.18-um 1T1MTJ Toggle MRAM with Balanced Three Input Sensing Scheme and Locally Mirrored Unidirectional Write Drivers," IEEE Journal of Solid-State Circuits, vol. 40, No. 1 Jan. 2005, 0018-9200 copyright 2005 IEEE.

Prejbeanu, I.L., et al., "Thermally Assisted MRAM," Journal of Physics: Condensed Matter, IOP Publishing, J. Phys.:C0ndens. Matter 19 (2007) 165218 (23 pp), 0953-8984/07/165218+23, copyright 2007 IOP Publishing Ltd.

Jubert, P.O., et al., "Magnetic Domain Walls in Constrained Geometrics," Physical Review B69, 220410(R)(2004) Rapid Communications, DOI: 10.1103/PhysRevB.69.220410, 0163-1829/2004/69(22)/1220410(4) copyright 2004 The American Physical Society.

Maffitt, T.M., et al., "Design Considerations for MRAM," 0018-8646/06, copyright 2006 by International Business Machines Corporation. IBM J. Res. & Dev. vol. 50, No. 1, Jan. 2006.

Elghefari, M., et al., Radiation Effects Assessment of MRAM Devices, National Aeronautics and Space Administration, JPL Publication Aug. 19, 2008.

\* cited by examiner

MAGNETIC RANDOM ACCESS MEMORY DEVICE AND METHOD FOR PRODUCING A MAGNETIC RANDOM ACCESS MEMORY DEVICE

CROSS-REFERENCE TO RELATED APPLICATIONS

This application is based upon and claims priority from prior Patent Cooperation Treaty Application No. PCT/IB2011/052491 filed on Jun. 8, 2011, which is based on and claims priority from European Patent Application No. 10168021.3, filed on Jun. 30, 2010, the entire disclosures of which are hereby incorporated by reference herein.

The invention relates to a Magnetic Random Access Memory (MRAM) device and to a method for producing an MRAM device.

BACKGROUND OF THE INVENTION

A non-volatile MRAM is adapted to store information in the magnetization of an array of memory bit cells. Such a conventional MRAM or MRAM device consists of a two-dimensional array of Magnetic Tunnel Junctions (MTJ), the memory bit cells, interconnected via word lines and bit lines. A conventional MTJ consists of two ferromagnetic layers separated by a thin dielectric tunnel barrier layer. One of these two ferromagnetic layers functions as a permanent magnet, the so-called fixed ferromagnetic layer or fixed layer. On the other side, the magnetization of the other layer, the so-called free magnetization layer or free layer, can be rotated by applying an external magnetic field, for example. The tunnel magneto resistance of the MTJ depends on the relative alignment of the magnetization of the free layer and the fixed layer. For addressing a single memory bit cell during a read operation, a one-dimensional selection scheme may be used (see reference [1]). For example, a read operation is accomplished by measuring the electrical resistance of a memory bit cell.

An alternative architecture for reading said memory bit cells consists in connecting each memory bit cell in the matrix using bit lines and word lines. Such a scheme is described in reference [2], for example. Further, in reference [3], a radiation effects assessment of MRAM devices is described.

Furthermore, referring to reference [4], thermally assisted writing in an MRAM device is shown. In reference [5], magnetic domain walls in constrained geometries are discussed.

Further, document US 2005/0242384 A1 describes a magnetic memory device comprising a magneto-resistance effect element that is provided at an intersection between a first write line and a second write line. Further, the magneto-resistance effect element has an easy axis that extends in a direction of extension of the first write line, and a first conductive layer for electrical connection to the magneto-resistance effect element, the first conductive layer having sides which are in flush with sides of the magneto-resistance effect element.

Moreover, document U.S. Pat. No. 7,245,524 B2 describes a magnetic memory device including a first write wiring which runs in a first direction, a second write wiring which runs in a second direction different from the first direction, and a magneto resistive element which is arranged at an intersection between the first and second write wirings, has a fixed layer, a recording layer, and a magneto resistive layer sandwiched between the fixed layer and the recording layer, and has an axis of easy magnetization obliquely with respect to the first and second directions, the recording layer including a first ferromagnetic layer, a second ferromagnetic layer, and a first nonmagnetic layer sandwiched between the first and second ferromagnetic layers, in which first magnetization of the first ferromagnetic layer and second magnetization of the second ferromagnetic layer are ferromagnetically coupled, and a ferromagnetic-coupling constant C of a ferromagnetic coupling is 0.0001 erg/cm$^2 \leq C \leq$ 0.2 erg/cm$^2$.

SUMMARY OF THE INVENTION

According to a first aspect of the invention, a Magnetic Random Access Memory (MRAM) device is suggested, the MRAM comprising read word lines, write word lines, bit lines, and a plurality of memory bit cells being interconnected via the read word lines, the write word lines and the bit lines, each of the memory bit cells having a fixed ferromagnetic layer element and a free ferromagnetic layer element separated by a dielectric tunnel barrier element, wherein each of the write word lines and a respective number of the free ferromagnetic layer elements are formed as one single, continuous ferromagnetic line.

According to a second aspect of the invention, a method for producing an MRAM device is provided, the method comprising the following steps:

providing read word lines, write word lines, and bit lines, providing a plurality of memory bit cells, wherein each of the memory bit cells is provided to have a fixed ferromagnetic layer element and a free ferromagnetic layer element being separated by a dielectric tunnel barrier element, wherein each of the write word lines and a respective number of the free ferromagnetic layer elements are formed as one single, continuous ferromagnetic line, and interconnecting the memory bit cells via the read word lines, the write word lines and the bit lines.

In some implementations, the MRAM device may also be called hybrid MRAM (HMRAM) device because the device is a mixture between race track memory and classical MRAM.

Thus, according to some implementations, the present HMRAM is adapted to achieve at the same time single cell selectivity and high packing density without the use of a bit cell switch.

Further, according to some implementations, the present HMRAM cell may achieve a fill factor of 4F2 as compared to a conventional MRAM cell which is greater than 40F2 (see references [1] and [2]).

Furthermore, according to some implementations, an elimination of the respective conventional cell selection switch may simplify the fabrication of the HMRAM device and may improve the uniformity of the tunnel barrier across the waver, thus reducing memory bit cell to bit cell variation of the resistance values.

Moreover, in some implementations, metastable magnetization states in the free layer may be avoided, thus significantly simplifying the memory cell geometry and the magnetic layer structures of the respective HMRAM bit cell. Further, the so-called half-select problem may be solved, without a complicated architecture. For example, the half-select problem is described in reference [6].

According to some implementations, the two-dimensional write selection scheme may be also used for reading the status of the respective memory bit cell. Inter alia to achieve this functionality, in the present HMRAM, the write word line and the free layer are merged into said one continuous ferromagnetic line. In this regard, the free layer element in the MTJ may be defined by the intersection of the bit line and the ferromagnetic write word line.

Further, in some implementations, the cell selection switch may be replaced by a read word line which may be arranged in parallel to the write word line.

Thus, according to some implementations, with this memory bit cell configuration, a two-dimensional selection scheme may be used for both, the read and write operations.

According to some implementations, there is an improvement of a radiation tolerance of the MRAM device due to the reduction of the chip area covered by CMOS technology, for example, in particular because single latch-up events in CMOS components are the main cause of device malfunction in radiation environments, as described in [3].

The present HMRAM bit cell may differ from a conventional MRAM bit cell in the design of the free layer element which is merged in the write word line to form one single continuous strip of ferromagnetic material. Due to shape anisotropy, the magnetization in the write word line may be parallel to the axis of the write word line and parallel or anti-parallel to the fixed magnetization of the bottom ferromagnetic part of the cell. If, for example, the write word line is initiated in a parallel orientation, the resulting tunnel magneto-resistance is low. To switch to the high resistive state, the magnetization under the bit line may have to be rotated by 180 degrees to align with the magnetic field generated by a current pulse travelling in the bit line. To achieve single cell selectivity, the field caused by the current pulse may be not sufficient to rotate the magnetization under the bit line. A second current pulse travelling in the write word line may heat up the ferromagnetic material through electrical power dissipation. Thus, the threshold field for achieving magnetization may be lowered. Only the memory bit cell located at the intersection of the write word line and the bit line may be subject to the combined effects of high temperature and the magnetic field so that the magnetization can align into the field. Compared to a conventional writing scheme in which the switching field is reached by the vectorial sum of the two fields generated by the orthogonal word and bit lines, the present scheme may avoid the above-discussed half-select problem in which cells on the same line are easy to switch because of the unavoidable spread in switching fields.

As the magnetization is rotated, two domain walls are nucleated and pinned at the edges of the bit line. The domain walls may be pinned in constrictions in the write word line. The geometry of the present HMRAM device may be such that a sufficient pinning potential is exerted on the domain walls, but likewise that the domain walls may also depin in the opposite field again.

In some implementations, the minimum distance between two bit lines may be given by at least twice of the domain walls width. While in soft magnetic materials such as permalloy equilibrium domain wall width may be as large as several 100 nm, referring to reference [5], a constrained wall may have a typical extension of the geometrical width of the constriction. Further, a transition from the high resistive state back to the low resistive state may be achieved in a similar way, except that the current pulse travelling in the bit line may have reversed polarity.

In one embodiment, the MRAM further may have dielectric layer elements, each of the dielectric layer elements being arranged between a respective one of the bit lines and the continuous ferromagnetic line for forming a capacitive element.

In a further embodiment, said capacitive element may be configured to form an insulator in writing operations.

Thus, because the capacitive element may form an insulator in writing operations, no current may flow in the writing operation between the bit line and the write word line, advantageously.

In a further embodiment, said capacitive element may be configured to form a conductor in reading operations.

Because the capacitive element may form a conductor in reading operations, a current may flow from the bit line over the word write line and the selected memory bit cell to the read word line. Thus, the selected memory cell may be read out.

In a further embodiment, said capacitive element may be configured to form an insulator in writing operations and to form a conductor in reading operations.

Thus, said described capacitive element may have a double function in dependence on the operation, namely the reading operation or the writing operation.

In a further embodiment, the memory bit cells may be arranged underneath a respective one of the write word lines, said respective one of the write word lines and the free ferromagnetic layer elements of the memory bit cells being formed as one single, continuous ferromagnetic line.

In a further embodiment, the memory bit cells are arranged as a matrix having rows and columns, wherein the memory bit cells arranged in one row may be connected to one write word line, wherein said one write word line and the free ferromagnetic layer elements of the memory bit cells of said one row are formed as one single, continuous ferromagnetic line.

In a further embodiment, the respective free ferromagnetic layer element of each of the memory bit cells is formed as a part of the continuous ferromagnetic line, the part being arranged in an intersection area of the continuous ferromagnetic line and the respective bit line.

In a further embodiment, the continuous ferromagnetic lines and the bit lines are arranged orthogonally to each other.

In a further embodiment, each of the respective read word lines may be arranged parallel to a respective one of the continuous ferromagnetic line and configured such that a two-dimensional selection scheme may be applicable for read operations and for write operations.

Advantageously, because of such an arrangement between the read word lines and the write word lines being part of the continuous ferromagnetic line, a two-dimensional section scheme may be applicable for both, the read operations and the write operations.

In a further embodiment, the memory bit cells may be arranged in a two-dimensional arrangement having rows and columns.

In a further embodiment, the memory bit cells may be arranged in a three-dimensional arrangement having a plurality of two-dimensional matrices of memory bit cells, said two-dimensional matrices being stacked on each other.

By using the present HMRAM cells, a three-dimensional arrangement of MRAM cells is possible advantageously.

In a further embodiment, the fixed ferromagnetic layer element and the free ferromagnetic layer element may be each formed by a ferromagnetic material, e.g. NiFe, CoFe, CoFeB, or MnFe. Further, said materials may be used in different composition ratios. MnFe may be used in multi-layered structures as an antiferromagnet.

In a further embodiment, the fixed ferromagnetic layer element may be configured to behave as a permanent magnet.

In a further embodiment, the free ferromagnetic layer element may be configured to be modifiable upon a predefined excitation, such as application of an external magnetic field and temperature.

In a further embodiment, the dielectric tunnel barrier element may comprise MgO or Al2O3.

In a further embodiment, the dielectric layer element may comprise a low K dielectric material, e.g. Nanopourous Silica, Hydrogensilsesquioxanes (HSQ), Teflon-AF (Polytetrafluoethylene or PTFE), Silicon Oxyflouride (FSG), or High K dielectric material, e.g. High K SiNx, Ta2O5, Al2O3, ZrO2, and HfO2, PZT.

In a further embodiment, the domain wall pinning sites are provided in a respective vicinity of intersection areas of the continuous ferromagnetic lines and the respective bit lines.

In a further embodiment, a shape of each of the respective domain wall pinning sites is embodied as a curved shape or a polygonal shape. In particular, the shape of the respective domain wall pinning site may be triangular, rectangular, pentagonal or parabolic In a further embodiment, a size of each of the respective domain wall pinning sites is configured in dependence on geometry and/or a material of the continuous ferromagnetic line. The domain wall width may depend on the material properties and on the width and thickness of the continuous ferromagnetic line. In particular, the size of the pinning site may be proportional to the width of the domain wall when it is located in the section of the wire of the continuous ferromagnetic line where no constriction is present.

In the following, exemplary embodiments of the present invention are described with reference to the enclosed figures.

Like or functionally alike elements in the figures have been allocated the same reference signs if not otherwise indicated.

DETAILED DESCRIPTION OF PREFERRED EMBODIMENTS

Figure 1:
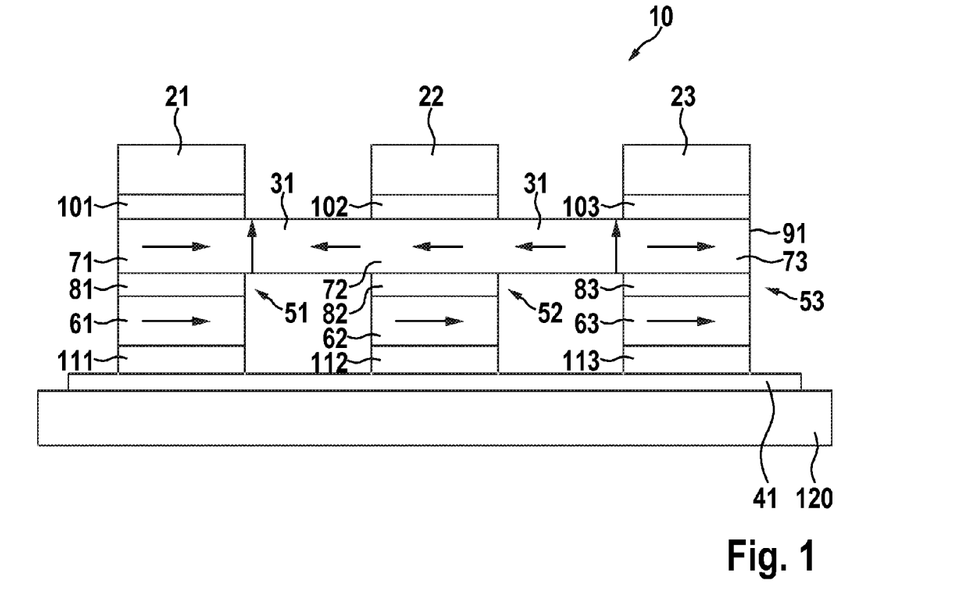
FIG. 1 shows a front view of a schematic block diagram of an embodiment of a Hybrid MRAM device.
Figure 2:
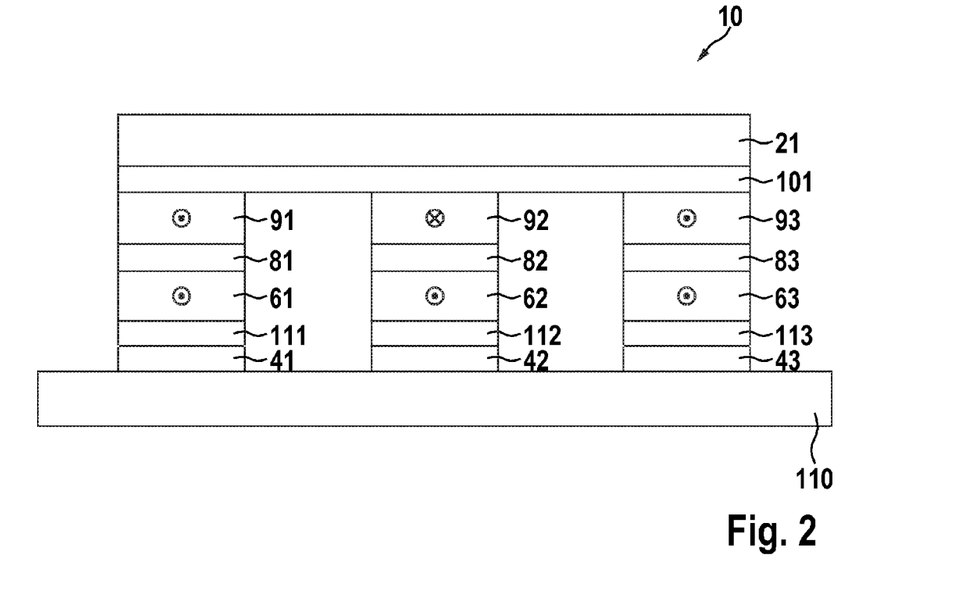
FIG. 2 shows a side view of the schematic block diagram of the embodiment of the Hybrid MRAM device of FIG. 1.
Figure 3:
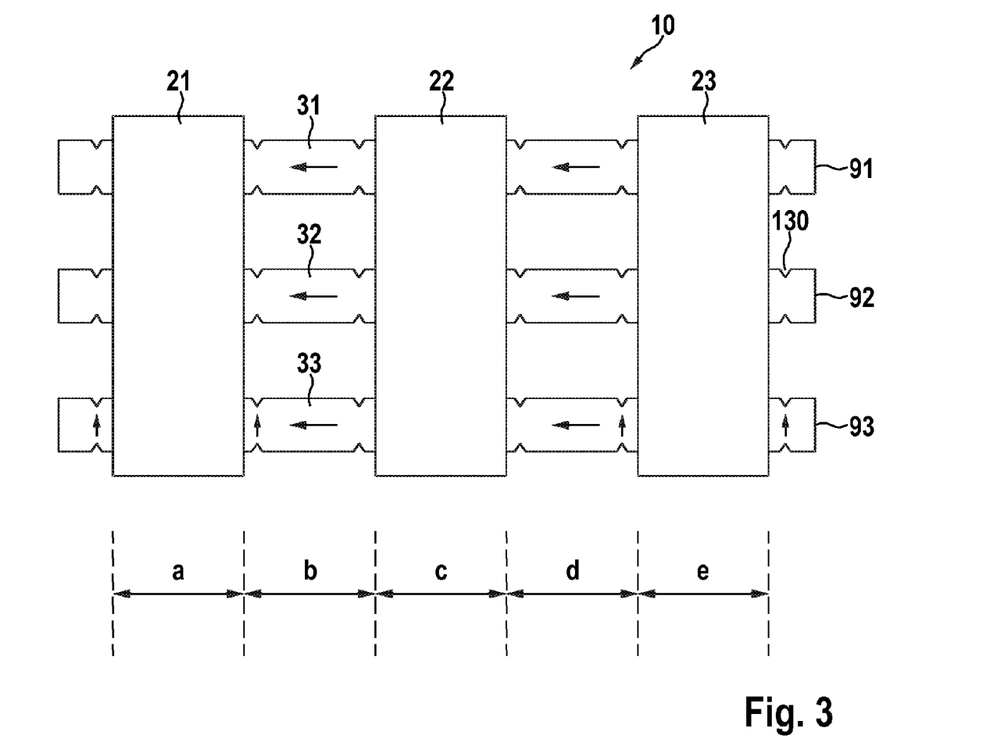
FIG. 3 shows a top view of the schematic block diagram of the embodiment of the Hybrid MRAM device of FIG. 1.

FIGS. 1 to 3 show different views of a schematic block diagram of an embodiment of a Hybrid MRAM (HMRAM) device 10. In particular, FIG. 1 depicts a front view, FIG. 2 a side view and FIG. 3 a top view of the HMRAM device 10.

Without loss of generality, the HMRAM device 10 of FIGS. 1 to 3 shows only an extract with three bit lines 21-23, three write word lines 31-33, three read word lines 41-43 and three memory bit cells 51-53.

Each of the memory bit cells 51-53 comprises a fixed ferromagnetic layer element 61-63 and a free ferromagnetic layer element 71-73. The fixed ferromagnetic layer element 61-63 and the free ferromagnetic layer element 71-73 are separated by a dielectric tunnel barrier element 81-83, respectively. For example, the left memory bit cell 51 has the fixed ferromagnetic layer element 61, the free ferromagnetic layer element 71 and the dielectric tunnel barrier element 81.

The respective fixed ferromagnetic layer element 61-63 and the respective free ferromagnetic layer element 71-73 are formed by a ferromagnetic material. Examples for such a ferromagnetic material are NiFe, CoFe, and CoFeB. The ferromagnetic materials of the fixed ferromagnetic layer element 61-63 and the free ferromagnetic layer element 71-73 may be equal or different.

Each of the free ferromagnetic layer elements 61-63 is configured to be modifiable upon a predefined excitation. Examples for such an excitation may be an application of an external magnetic field and temperature.

In particular, with respect to FIG. 3, the memory bit cells 51-53 may be arranged as a matrix having rows and columns. The memory bit cells arranged in one row, for example the memory bit cells 51-53, are connected to one single write word line, namely write word line 31. Said one write word line 31 and the free ferromagnetic layer elements 71-73 of these memory bit cells 51-53 of said one row are formed as one single, continuous ferromagnetic line 91. The same may apply to the further continuous ferromagnetic lines 92 and 93.

Further, with respect to FIG. 3, domain wall pinning sites, exemplarily referenced by reference sign 130, are provided in a respective vicinity of intersection areas of the continuous ferromagnetic lines 91-93 and the respective bit lines 21-23. Particularly, the size of each of the respective domain wall pinning sites 130 is configured in dependence on geometry and/or a material of the respective continuous ferromagnetic line 91-93.

Furthermore, said memory bit cells 51-53 may be arranged in a three-dimensional arrangement having a plurality of the discussed two-dimensional matrices of memory bit cells 51-53, wherein said two-dimensional matrices may be stacked on each other.

Further, between each of the respective bit lines 21-23 and each of the respective continuous ferromagnetic lines 91-93, there may be a dielectric layer element 101-103 for forming a capacitive element between the respective bit line 21-23 and the respective continuous ferromagnetic line 91-93. Said capacitive element formed by said dielectric layer 101-103 may be adapted to form an isolator in writing operations and adapted to form a conductor in reading operations.

For example, with reference to FIG. 1, the write word line 31 and the free ferromagnetic layer elements 71-73 of the memory bit cells 51-53 arranged underneath said write word line 31 are formed as said one single continuous ferromagnetic line 91.

Further, with reference to FIGS. 1 and 2, each of the respective read word lines 41-43 is arranged in parallel to each of the respective continuous ferromagnetic lines 91-93 and configured such that a two-dimensional selection scheme may be applicable for read operations and for write operations of the HMRAM device 10. For example, the read word line 41 is arranged in parallel to the continuous ferromagnetic line 91 and thus in parallel to the write word line 31 as a part of said continuous ferromagnetic line 91.

Further, with reference to FIGS. 1 and 2, a diode layer 111-113 is arranged between the fixed ferromagnetic layer element 61-63 and each of the respective read word lines 41-43. Said diode layer 111-113 may be adapted to provide a selection mechanism for the respective memory bit cell 51-53. The use of such a diode or diode layer is known from U.S. Pat. No. 7,245,524 B2.

Figure 4:
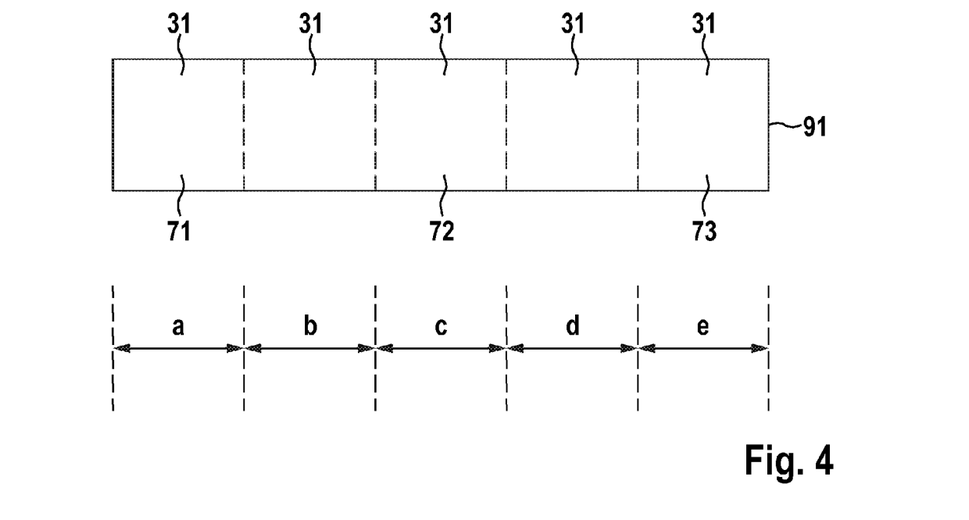
FIG. 4 shows a schematic block diagram of a continuous ferromagnetic line including the functionality of a write word line and of a number of free ferromagnetic layer elements.

FIG. 4 shows a detailed schematic block diagram of a continuous ferromagnetic line 91 including the functionality of a write word line 31 and of a number of free ferromagnetic elements 71-73. In particular, FIG. 4 illustrates that the continuous ferromagnetic line 91 has a number of different sections a-e comprising different functionality.

The sections a, c and e are arranged underneath a respective bit line 21-23 (see FIG. 3). In contrast, the sections b and d are not arranged underneath any bit line. In sections a, c, and e, the respective free ferromagnetic layer element 71-73 of the respective memory bit cell 51-53 may be formed as a part of said continuous ferromagnetic line 91. (see also FIG. 3).

Figure 5:
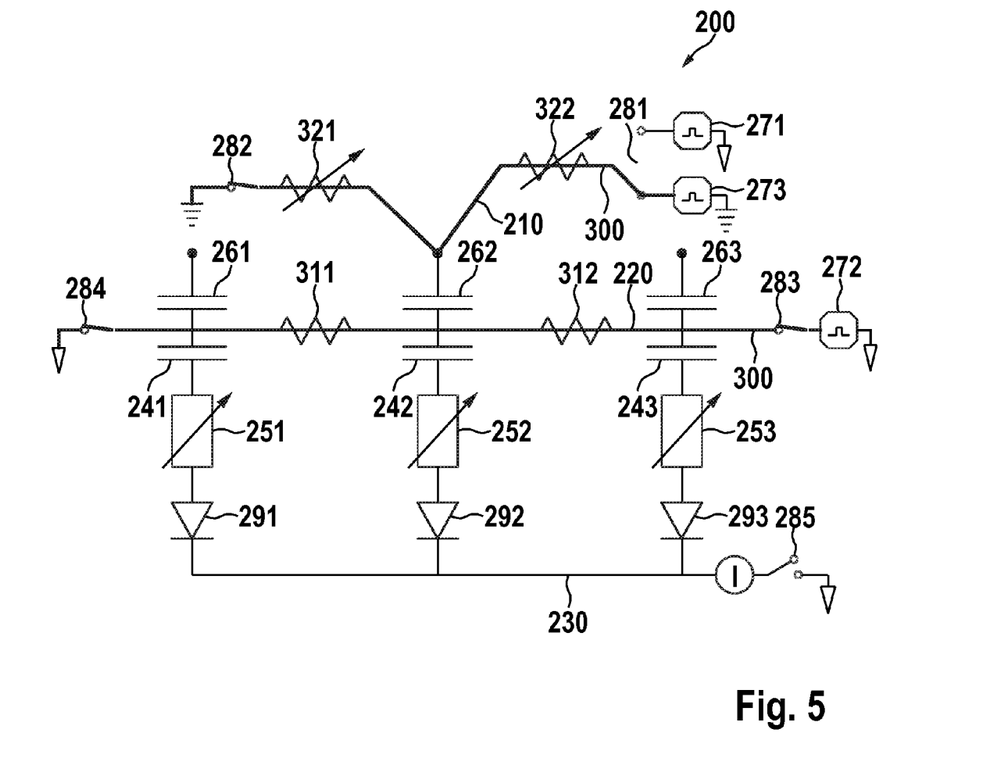
FIG. 5 shows an equivalent circuit of an HMRAM cell of FIGS. 1 to 3 configured for write operations.
Figure 6:
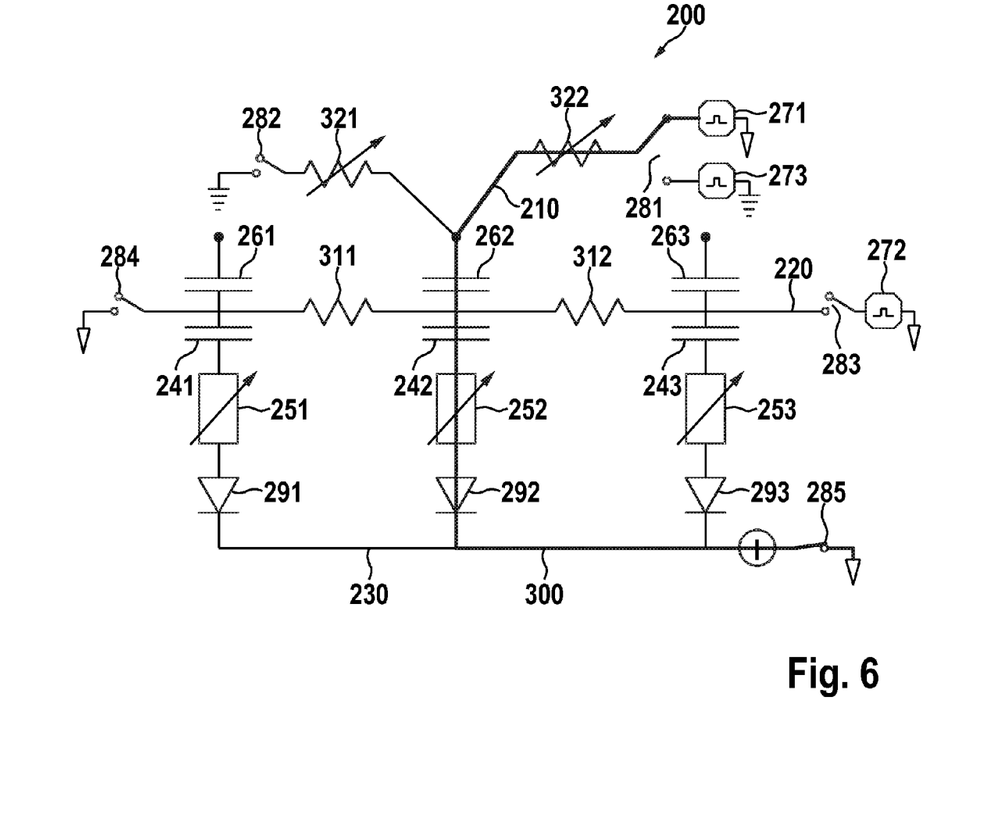
FIG. 6 shows an equivalent circuit of the HMRAM cell of FIGS. 1 to 3 configured for read operations.

FIGS. 5 and 6 show an equivalent circuit 200 of an HMRAM cell 10 of FIGS. 1-3 configured for write operations and configured for read operations, respectively.

The equivalent circuit 200 of the HMRAM cell 10 illustrates the current path during a write operation and the read operation, respectively. The current paths 300 are bold printed.

The equivalent circuit 200 of FIGS. 5 and 6 has a bit line 210, a write word line 220, and a read word line 230.

In the equivalent circuit 200, the respective memory cell 51-53 of FIGS. 1-3 with the fixed layer element 61-63, the free layer element 71-73 and the dielectric tunnel barrier element 81-83 is represented by a capacitor 241-243 and a variable resistor 251-253 connected in series. For example, the memory cell 51 is represented by the capacitor 241 and the variable resistor 251. Each of the respective capacitors 241-243 may have a capacitive value C1. Each of the respective variable resistors 251-253 may have a resistance value R1. Each of the respective variable resistors 251-253 can only switch between two states $R1_{high}$ and $R1_{low}$ for the anti-parallel and parallel magnetization configuration of the ferromagnetic layers 61-63 and 71-73, respectively.

Each of the respective dielectric layers 101-103 of FIGS. 1-3 between the bit line 21-23 and the write word line 31-33 (continuous ferromagnetic line 91-93) is represented by a capacitor 261-263 having a respective capacitance value C2.

For injecting the current in the bit line 210 to generate a magnetic field, a first pulse generator 271 is used. Further, a second pulse generator 272 is used to inject current in the write word line 220 to raise the temperature in the free ferromagnetic layer. For injecting the current in the bit line 210 to generate a magnetic field, a first pulse generator 271 is used. Further, a second pulse generator 272 is used to inject current in the write word line 220 to raise the temperature in the free ferromagnetic layer. Moreover, the second pulse generator 272 used during a write operation may be referenced to a separate potential, in particular to a separate ground plane with respect to pulse generator 271. Moreover, pulse generator 273 may be switched into the circuit 200 during a read operation and may inject the current pulse through the bit line 210, the memory bit cell and the read word line to read the status of the respective memory bit cell.

The resistance of the segment of the write word line 220 between two bit cells may have the resistance value R2 and is designated by 311, 312. Further, the resistance segments 321, 322 of the bit line 210 before and after the selected cell may have a respective resistance value R3.

In particular, said FIG. 5 shows the current path 300 of the write operation. Further, with reference to FIG. 5, the circuit 200 is set up in the following way. The first pulse generator 271 is switched into the circuit 200 by means of switches 281 and 282. Moreover, the second pulse generator 272 is connected to the circuit 200 by means of the switches 283 and 284.

Due to the rectification of the diodes 291-293, no current loops may be sustained between the memory bit cells. Further, no current may flow between the bit line 210 and the write word line 220 although they are capacitively coupled by the capacitors 261-263 since they are referenced to separate grounds by means of switches 282 and 284. Since the first and second pulse generators 271, 272, 273 may be current sources and losses along the lines 210 and 220 may be minimized, the amplitude of the field and the heat dissipated in the write word line 220 may be the same for every memory bit cell. Alternatively, the first and second pulse generators 271, 272, 273 may be embodied as voltage sources.

With reference to FIG. 6, a corresponding read operation is shown, wherein the reference sign 300 shows the current path during said read operation.

Further, with reference to FIG. 6, the circuit 200 is set up in the following way: The first pulse generator 273 is switched into the circuit 200 by means of switch 281 (282 is open) and the read word line 230 is grounded by means of switch 285.

The current pulse generated by the first pulse generator 273 in the bit line 210 propagates only through the memory bit cell located at the intersection with the word read line 230. The amplitude and the duration of the pulse may be not sufficient to nucleate or depin and propagate the domain walls.

To guarantee the selectivity of the read operation, the ratio between R2 and $R1_{high}$–$R1_{low}$ may be greater than 1. This may ensure that the diodes 291-293 in adjacent memory bit cells may not become conductive. 'The number of memory cells connected by the same bit line 210 may be limited by the resistance segment 322 with the resistance value R3 and the difference between R1 and the difference $R1_{high}$–$R1_{low}$.

Figure 7:
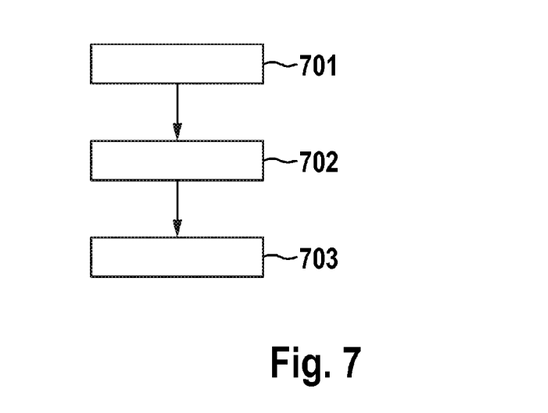
FIG. 7 shows an embodiment of a sequence of method steps for producing an HMRAM device.

Further, FIG. 7 shows an embodiment of a sequence of method steps for producing a HMRAM device 10. The method of FIG. 7 is described with reference to FIGS. 1-3.

In a step 701, bit lines 21-23, write word lines 31-33 and read word lines 41-43 are provided.

In a step 702, a plurality of memory bit cells 51-53 is provided, wherein each of the memory bit cells 51-53 is provided to have a fixed ferromagnetic layer element 61-63 and a free ferromagnetic layer element 71-73 separated by a dielectric tunnel barrier element 81-83. Each of the write word lines 31-33 and a respective number of the free ferromagnetic layer elements 71-73 are formed as one single, continuous ferromagnetic line 91-93.

Further, in a step 703, the memory bit cells 51-53 are interconnected by said bit lines 21-23, said write word lines 31-33 and said read word lines 41-43.

All above-mentioned embodiments of the methods of the present invention may be embodied by respective means to be a respective embodiment of the device of the invention present invention.

What has been described herein is merely illustrative of the application of the principles of the present invention. Other arrangements and systems may be implemented by those skilled in the art without departing from the scope and spirit of this invention.

What is claimed is:

1. Magnetic random access memory (hereinafter "MRAM") device, comprising:
   bit lines;
   write word lines;
   read word lines; and
   a plurality of memory bit cells being interconnected via the bit lines, the write word lines and the read word lines, each of the memory bit cells having a fixed ferromagnetic layer element and a free ferromagnetic layer element separated by a dielectric tunnel barrier element,
   wherein each of the write word lines and a respective number of the free ferromagnetic layer elements are formed as one single, continuous ferromagnetic line.

2. The MRAM device of claim 1,
further comprising dielectric layer elements, each of the dielectric layer elements being arranged between a respective one of the bit lines and the continuous ferromagnetic line for forming a capacitive element.

3. The MRAM device of claim 2,
wherein said capacitive element is configured to form an insulator in writing operations.

4. The MRAM device of claim 3,
wherein said capacitive element is configured to form a conductor in reading operations.

5. The MRAM device of claim 2,
wherein said capacitive element is configured to form an insulator in writing operations and to form a conductor in reading operations.

6. The MRAM device of claim 1,
wherein the memory bit cells are arranged underneath a respective one of the write word lines, said respective one of the write word lines and the free ferromagnetic layer elements of the memory bit cells being formed as one single, continuous ferromagnetic line.

7. The MRAM device of claim 1,
wherein the memory bit cells are arranged as a matrix having rows and columns,
wherein the memory bit cells arranged in one row are connected to one write word line, and
wherein said one write word line and the free ferromagnetic layer elements of the memory bit cells of said one row are formed as one single, continuous ferromagnetic line.

8. The MRAM device of claim 1,
wherein the respective free ferromagnetic layer element of the respective memory bit cell is formed as a part of the continuous ferromagnetic line, the part being arranged in an intersection area of the continuous ferromagnetic line and the respective bit line.

9. The MRAM device of claim 1,
wherein each of the read word lines is arranged parallel to a respective one of the continuous ferromagnetic lines and configured such that a two-dimensional selection scheme may be applicable for read operations and for write operations.

10. The MRAM device of claim 1,
wherein the memory bit cells are arranged in a three-dimensional arrangement having a plurality of two-dimensional matrices of memory bit cells, said two-dimensional matrices being stacked on each other.

11. The MRAM device of claim 1,
wherein the fixed ferromagnetic layer element and the free ferromagnetic layer element are each formed by a ferromagnetic material.

12. The MRAM device of claim 11,
wherein the ferromagnetic material comprises at least one of NiFe, CoFe and CoFeB.

13. The MRAM device of claim 1,
wherein the free ferromagnetic layer element is configured to be modifiable upon a predefined excitation.

14. The MRAM device of claim 13,
wherein the predefined excitation comprises application of at least one of temperature and an external magnetic field.

15. The MRAM device of claim 1,
wherein domain wall pinning sites are provided in a respective vicinity of intersection areas of the continuous ferromagnetic lines and respective bit lines.

16. The MRAM device of claim 15,
wherein a shape of each of the domain wall pinning sites is embodied as one of a curved shape and a polygonal shape, and
wherein a size of each of the domain wall pinning sites is configured in dependence on geometry and/or a material of the continuous ferromagnetic line.

17. A method for producing a magnetic random access memory (hereinafter "MRAM") device, the method comprising:
providing read word lines, write word lines, and bit lines;
providing a plurality of memory bit cells, wherein each of the memory bit cells is provided to have a fixed ferromagnetic layer element and a free ferromagnetic layer element being separated by a dielectric tunnel barrier element, wherein each of the write word lines and a respective number of the free ferromagnetic layer elements are formed as one single, continuous ferromagnetic line; and
interconnecting the memory bit cells via the read word lines, the write word lines and the bit lines.

* * * * *